(12) United States Patent
Ziemba et al.

(10) Patent No.: US 9,601,283 B2
(45) Date of Patent: Mar. 21, 2017

(54) EFFICIENT IGBT SWITCHING

(71) Applicant: Eagle Harbor Technologies, Inc., Seattle, WA (US)

(72) Inventors: Timothy Ziemba, Bainbridge Island, WA (US); Kenneth E. Miller, Seattle, WA (US); John G. Carscadden, Seattle, WA (US); James Prager, Seattle, WA (US)

(73) Assignee: EAGLE HARBOR TECHNOLOGIES INC., Seattle, WA (US)

( * ) Notice: Subject to any disclaimer, the term of this patent is extended or adjusted under 35 U.S.C. 154(b) by 0 days.

(21) Appl. No.: 14/512,897

(22) Filed: Oct. 13, 2014

(65) Prior Publication Data
US 2015/0028932 A1 Jan. 29, 2015

Related U.S. Application Data

(63) Continuation of application No. 13/345,906, filed on Jan. 9, 2012, now Pat. No. 8,963,377.

(51) Int. Cl.
*H01H 9/54* (2006.01)
*H03K 17/567* (2006.01)
*H03K 17/04* (2006.01)

(52) U.S. Cl.
CPC .......... *H01H 9/54* (2013.01); *H03K 17/0406* (2013.01); *H03K 17/567* (2013.01); *H03K 2217/0036* (2013.01); *Y10T 307/944* (2015.04)

(58) Field of Classification Search
CPC ...... H01H 9/54; H03K 17/046; H03K 17/567; H03K 2217/0036; Y10T 307/944

USPC .................. 307/140; 327/365, 434
See application file for complete search history.

(56) References Cited

U.S. PATENT DOCUMENTS

| 5,808,504 A | 9/1998 | Chikai et al. |
| 6,897,574 B2 | 5/2005 | Vaysse |
| 7,319,579 B2 | 1/2008 | Inoue et al. |

OTHER PUBLICATIONS

Bland, M., et al., "A High Power RF Power Supply for High Energy Physics Applications," Proceedings of the Particle Accelerator Conference, Knoxville, TN, May 16-20, 2005, pp. 4018-4020.
In, Y., et al., "On the roles of direct feedback and error field correction in stabilizing resistive-wall modes," Nuclear Fusion, 2010, retrieved from http://stacks.iop.org/NF/50/042001 on Apr. 12, 2012, vol. 50, No. 4,5 pages.
Kim, J., et al., "High Voltage Pulsed Power Supply Using IGBT Stacks," IEEE Transactions on Dielectrics and Electrical Insulation, Aug. 2007, vol. 14, No. 4, 921-926.
Locher, R., "Introduction to Power MOSFETs and their Applications (Application Note 558)," Fairchild Semiconductor, Oct. 1998, 15 pages.

(Continued)

*Primary Examiner* — Hal Kaplan

(57) ABSTRACT

Embodiments of the invention provide IGBT circuit modules with increased efficiencies. These efficiencies can be realized in a number of ways. In some embodiments, the gate resistance and/or voltage can be minimized. In some embodiments, the IGBT circuit module can be switched using an isolated receiver such as a fiber optic receiver. In some embodiments, a single driver can drive a single IGBT. And in some embodiments, a current bypass circuit can be included. Various other embodiments of the invention are disclosed.

20 Claims, 6 Drawing Sheets

(56) References Cited

OTHER PUBLICATIONS

Locher, R., et al., "Use of BiMOSFETs in Modern Radar Transmitters," IEEE International Conference on Power Electronics and Drive Systems, Indonesia, 2001, pp. 776-782.

Reass, W., et al., "Progress Towards a 20 KV, 2 KA Plasma Source Ion Implantation Modulator for Automotive Production of Diamond Film on Aluminum," Submitted to 22nd International Power Symposium, Boca Raton, FL, Jun. 24-27, 1996, 6 pages.

Scoville, J., et al., "Resistive Wall Mode Feedback Control System on DIII-D," IEEE/NPSS 18th Symposium on Fusion Engineering, Albuquerque, NM, Oct. 25-29, 1999, General Atomics Report GA-A23256, Nov. 1999, 7 pages.

Zavadtsev, D., et al., "Compact Electron Linear Accelerator RELUS-5 for Radiation Technology Application," 10th European Particle Accelerator Conference, Edinburgh, UK, Jun. 26-30, 2006, 3 pages.

Office Action mailed Sep. 12, 2014 in U.S. Appl. No. 13/345,906 (pdf.14).

EFFICIENT IGBT SWITCHING

BACKGROUND

The Insulated Gate Bipolar Transistor (IGBT) is a minority-carrier device with high input impedance and large bipolar current-carrying capability. Many designers view IGBTs as devices with MOS input characteristics and bipolar output characteristics that are voltage-controlled bipolar devices. The IGBT is a functional integration of Power MOSFET and BJT devices in monolithic form and combines the best attributes of both to achieve optimal device characteristics.

The IGBT is suitable for many applications in power electronics, especially in Pulse Width Modulated (PWM) servo and three-phase drives requiring high dynamic range control and low noise. It also can be used in Uninterruptible Power Supplies (UPS), Switched-Mode Power Supplies (SMPS), and other power circuits requiring high switch repetition rates. IGBT improves dynamic performance and efficiency and reduces the level of audible noise. It is equally suitable in resonant-mode converter circuits. Optimized IGBTs are available for both low conduction loss and low switching loss.

SUMMARY

Embodiments of the invention provide IGBT circuit modules with improved efficiencies. These efficiencies can be realized in a number of ways. In some embodiments, the gate resistance and/or inductance can be minimized. In some embodiments, the IGBT circuit module can be switched using an isolated receiver such as a fiber optic receiver. In some embodiments, a single driver can drive a single IGBT. And in some embodiments, a current bypass circuit can be included. Various other embodiments of the invention are disclosed.

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, and or all drawings and each claim.

BRIEF DESCRIPTION OF THE DRAWINGS

Illustrative embodiments of the present invention are described in detail below with reference to the following figures.

DETAILED DESCRIPTION OF THE INVENTION

Figure 1:
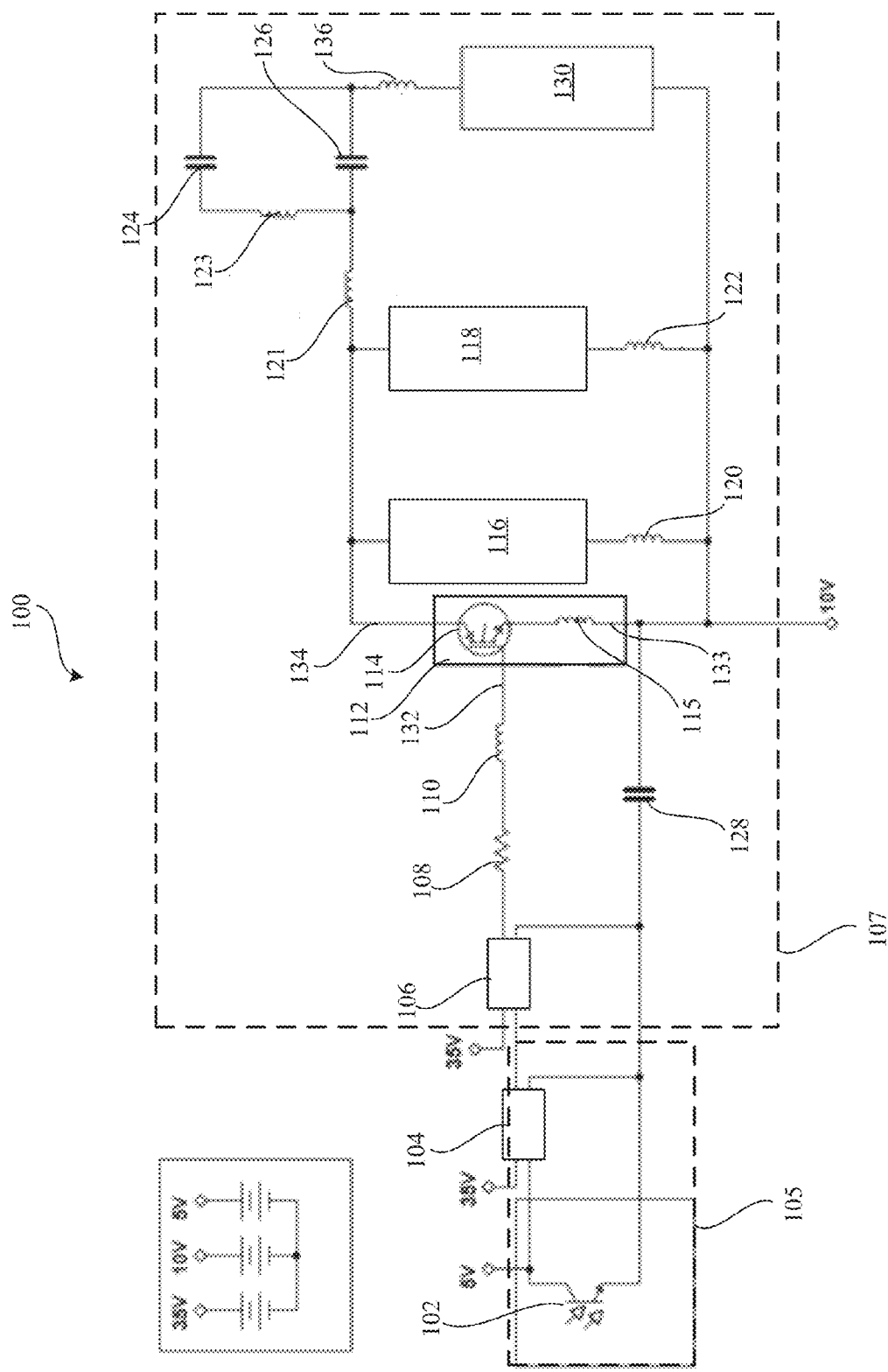
FIG. 1 is a circuit diagram of an IGBT circuit module according to some embodiments of the invention.

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described. Like numerals within the drawings and mentioned herein represent substantially identical structural elements. Each example is provided by way of explanation, and not as a limitation. For instance, features illustrated or described as part of one embodiment may be used on another embodiment to yield a further embodiment. Thus, it is intended that this disclosure includes modifications and variations.

Embodiments of the invention include power supply modules with insulated-gate bipolar transistors (IGBT) that operate with improved efficiencies. These modules can include IGBT circuit modules that can produce high power output (e.g., above 100 kW) with little power loss. Each circuit module can include a single IGBT. Multiple circuit modules may be configured in parallel and/or series configurations. Among other efficiencies, these efficiencies can be realized with decreased turn-on times and/or turn-off times as well as lowering losses during switching. Although these efficiencies may be incremental for each individual cycle, when aggregated over many IGBT circuit modules and over the many cycles per second, such efficiencies can result in significant power savings.

Embodiments of the invention can be used in a number of applications. In particular, these devices can be used with solar panels, solar farms, windmills, hydroelectric facilities, coal power facilities, power transmission, power conversion, electric vehicles, air planes, and/or satellites. IGBT modules disclosed here in can provide value added functions such as frequency regulation, renewable firming, power quality enhancement, and/or dynamic stability support. Often power conversion systems can be a source of power loss. Improvements to power conversion systems will improve the efficiencies of the system. Any such efficiency improvements will lessen the environmental impact on the system as a whole. Thus embodiments of the invention are a green technology solution.

IGBT manufacturers produce a variety of IGBTs with different operating characteristics that require various design considerations. Despite these various characteristics, embodiments of the invention can be used with any type of IGBT. Embodiments of the invention can be used with discrete and/or brick IGBTs. Typically, IGBTs include manufacturer specifications that include such things as rise time, turn-on delay time, turn-off delay time, various operating voltages and currents, turn-on switching loss, delay times, and/or turn-off switching loss to name a few. In many instances, embodiments of the invention push IGBTs beyond or up to the manufacturer's specifications to obtain improved efficiencies. One example of an IGBT is model number IRGPS40B120UP manufactured by International Rectifier.

FIG. 1 is a circuit diagram of IGBT circuit module 100 according to one embodiment of the invention. IGBT circuit module 100 includes IGBT 114 along with a number of components arranged to ensure fast and/or more efficient switching of load 130. Circuit module 100 shows a number of elements that can vary in location, combination, value, and/or configuration. Indeed, some elements can be replaced or removed. Others represent inherent characteristics of the circuit module and/or circuit components such as trace resistance and/or component inductance. Elements representing inherent characteristics may not be actual physical components. Instead, these elements are shown simply for discussion purposes and/or to describe that such characteristics may be present.

Receiver 102 is coupled to an external input and receives input switching signals. While receiver 102 is coupled with a 5 volt power supply any type of receiver operating at any voltage or power level may be used. Receiver 102 can be isolated from the environment and/or from the remaining circuitry in a number of ways. For example, receiver 102 can be a fiber optic receiver that allows each IGBT module 100 to float relative to other IGBT modules or other circuitry. Individual module grounds can be isolated from one another, for example, using an isolation transformer. Electrical isolation of IGBT module 100 can allow multiple IGBT circuit modules to be arranged in a series configuration for high voltage switching. Fiber optic receivers can also be used to reduce switching noise.

Pre-driver 104 and gate driver 106 can provide large current pulses greater than 10 amps and continuous current greater than 2 amps to IGBT 114. These drivers can be any of high speed, high current drivers designed for use with either MOSFETs and/or IGBTs. For example, these drivers can be any low-side ultrafast driver manufactured by IXYS Corporation (e.g., IXYS #IXDN430 or IXYS #IXDN630).

Figure 2:
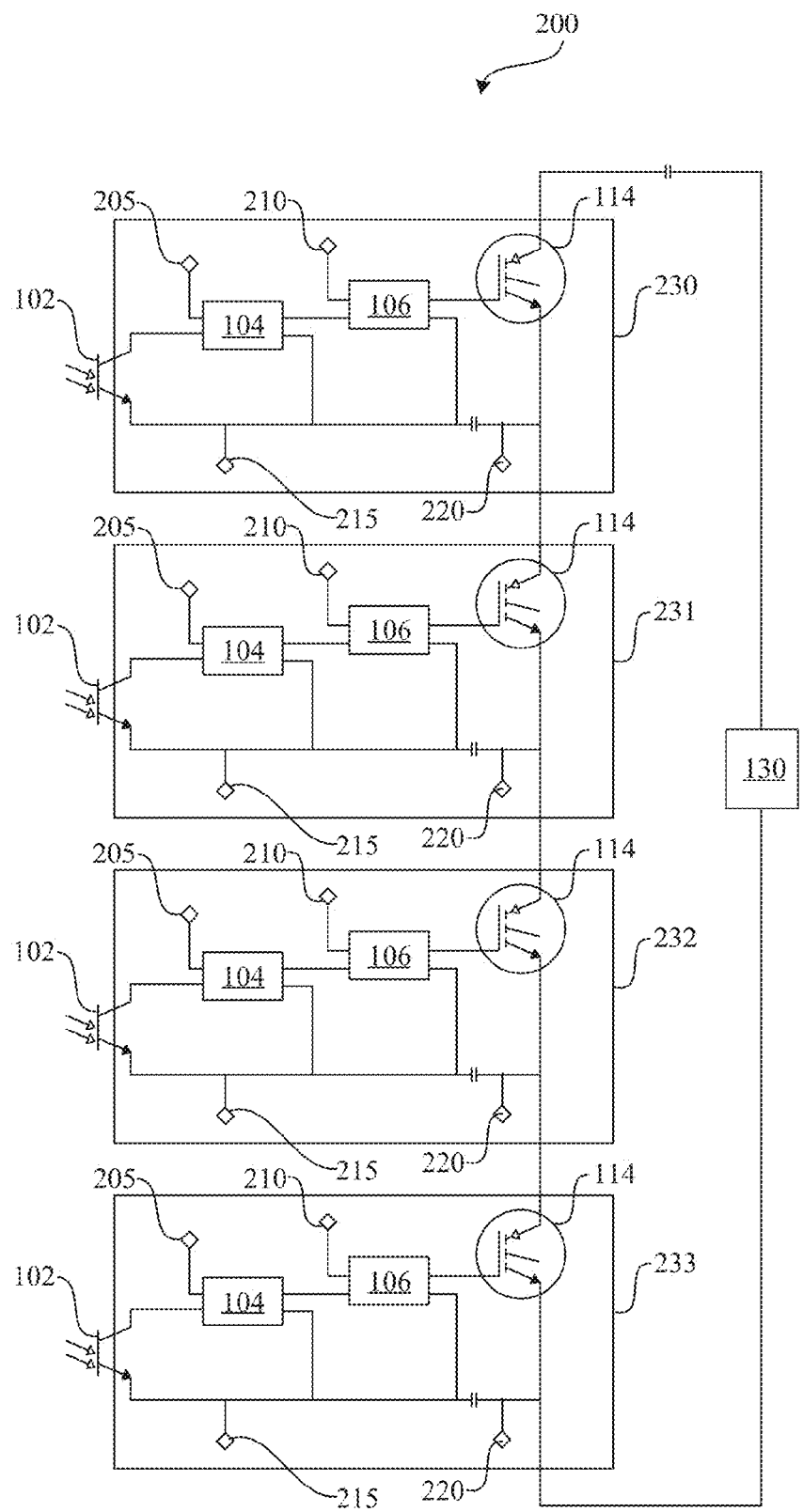
FIG. 2 shows a receiver and pre-driver circuit and an IGBT circuit according to some embodiments of the invention.

Pre-driver 104 is electrically coupled with the output of receiver 102 and the output of pre-driver 104 is electrically coupled with gate driver 106 resulting in a dual-driver configuration. In the configuration shown, these drivers are coupled with a 35 volt power supply, although any power supply will work. Moreover, these drivers may not be coupled with the same power supply. While fiber optic receiver 102, pre-driver 104 and gate driver 106 are shown, various other receiver and driver combinations can be used such as, for example, a single receiver coupled with a single driver. In some configurations, pre-driver 104 and receiver 102 can be included on receiver circuit module 105 separate from circuit module 107. In other configurations, these devices can be located on the same circuit module as IGBT 114 and other components. Furthermore, pre-driver 104 can be coupled in parallel with a plurality of gate drivers that drive a plurality of IGBTs as shown in FIG. 2.

The output of gate driver 106 is electrically coupled with gate 132 of IGBT 114. IGBT 114 can include internal emitter inductance ($L_e$) 115 within effective IGBT 112. Resistance 108 and/or inductance 110 show the internal resistance and/or inductance of the gate and may not be an additional component, although an additional component may be used for each. That is, the output of gate driver 106 can be directly coupled with gate 132 of IGBT 114 using a circuit trace and/or an additional component and/or additional components. Typical IGBTs include specifications that a gate resistor is required between gate driver 106 and gate 132. Thus, the elimination of such a resistor is contrary to typical IGBT specifications.

Resistance 108 can be the effective internal resistance at the gate. This resistance can include the resistance of the trace between gate driver 106 and IGBT 114 and/or any internal resistance within the gate of IGBT 114. Resistor 108 can have a resistance less than 2Ω, 1Ω, 500 mΩ, 100 mΩ, 50 mΩ, 10 mΩ, or 1 mΩ. To achieve these low resistance levels, the output of gate driver 106 and gate 132 of IGBT 114 can have a very short physical trace length. This distance can be, for example, less than 1 cm, 500 mm, 100 mm, 50 mm, 10 mm, or 1 mm.

Inductance 110 can represent the internal inductance of the gate. This inductance can include the inductance of the trace between gate driver 106 and IGBT 114 and/or any internal inductance within the gate of IGBT 114. Inductance 110 may or may not be an added component. Inductance 110 can have an inductance less than 100 nH, 50 nH, 40 nH, 20 nH, 10 nH, 5 nH, or 1 nH. To achieve these low inductance levels, the trace on the circuit module connecting the output of gate driver 106 and IGBT 114 can have a wide trace width. For example, this width can be greater than 1 mm, 2 mm, 3 mm, 4 mm, 5 mm, 6 mm, 7 mm, 8 mm, 9 mm, or 10 mm.

IGBT 114 can include collector 134 and emitter 133. Emitter 133 is coupled with a 10 volt bias voltage. In other embodiments, emitter 133 can be coupled to other bias voltages including ground. Load 130 is coupled with collector 134 and emitter 133.

Current bypass circuit 116 can be electrically coupled between emitter 133 and collector 134. This bypass may include some circuit inductance represented by bypass inductance 120. Current bypass circuit 116 can be designed to allow for an easy current bypass to IGBT 114. Capacitor 128 can be included between emitter 133 and gate driver 106.

Snubber 118 can also be included between collector 134 and emitter 133. Snubber 118 may include additional components and/or connections. Moreover, Snubber 118 may or may not include connections at collector 134 and/or emitter 133. Snubber 118 can include any type of snubber circuitry known in the art. For example, snubber 118 can include a diode snubber, RF snubber, solid-state snubber, or a combination of these. For example, snubber 118 can include a capacitor in series with a parallel configuration of a diode and a resistor. Snubber 118 can also include snubber inductance 122 whether as part of snubber 118 or as inductance within the snubber circuit. Snubber 118 can be used to suppress voltage transients across load 130 and/or absorb energy from stray circuit inductance to prevent over-voltage at IGBT 114. Current bypass circuit 116 and snubber 118 can be included in a single circuit.

IGBT circuit module 100 can also include fast capacitor 126 and slow capacitor 124 in parallel between collector 134 and load 130. These capacitors can have inherent inductance represented by fast capacitor inductance 121 and slow capacitor inductance 123. In some embodiments, these inductances may result from actual inductors. In others, these inductances may be inductances within the circuit and/or capacitors 124 and 126. Fast capacitor 126 and/or slow capacitor 124 may be located externally to IGBT circuit module 100, and/or may span multiple IGBT circuit modules, and may not connect to each IGBT circuit module.

Fast capacitor 126 can be in parallel with a main energy storage capacitor (e.g., slow capacitor 124). Fast capacitor 126 may only store a small portion of the total energy required, which can allow it to be smaller, and/or be placed closer to the IGBT switch than main energy storage capacitor. In so doing, stray inductance between fast capacitor 126 and IGBT 114 can be minimized. Fast capacitor 126 can absorb energy stored in the stray inductance between itself and the main energy storage capacitor, which can reduce the energy dissipated in IGBT 114 during switching.

Figure 3:
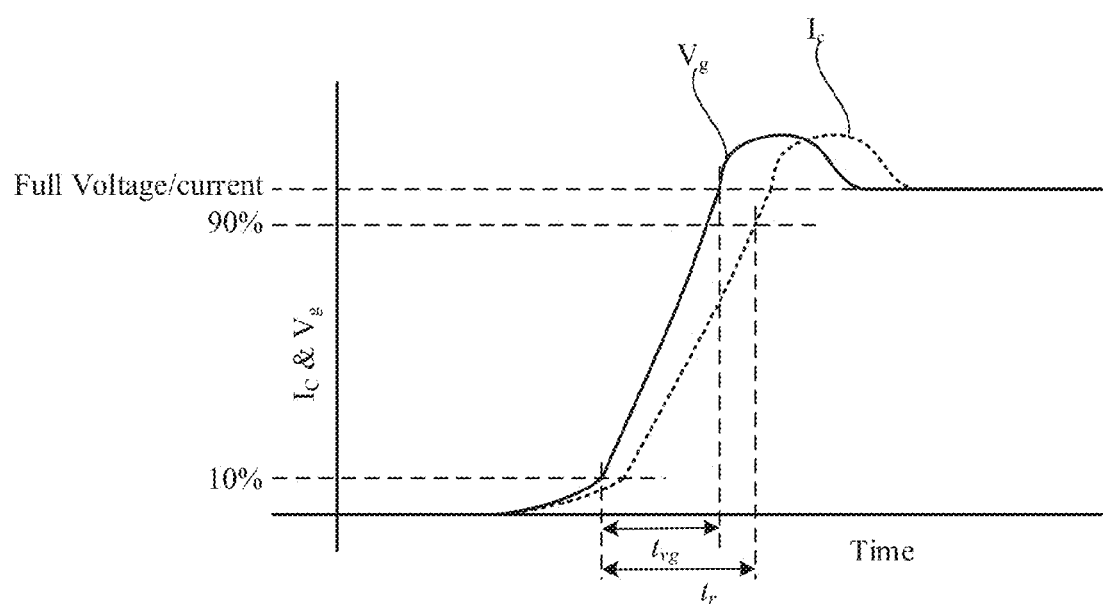
FIG. 3 is a graph of the rise time of the voltage at the gate and the rise time of the current through an IGBT according to some embodiments of the invention.

Embodiments of the invention can allow for rapid IGBT gate charging. For example, gate 132 of IGBT 114 can be brought to the full IGBT manufacture's specified Gate to Emitter Voltage (e.g., $V_{GE}$>20 volts) in a time ($t_{vg}$) less than the manufacturer-specified 10% to 90% current rise time ($t_r$) as shown in FIG. 3. Additionally embodiments of the invention can allow for rapid IGBT discharging by reducing $V_{GE}$ from the manufacture's specified on state voltage to less than or equal to zero in a time less than the manufacturer-specified 10% to 90% current rise time ($t_r$). These rise times can vary depending on the IGBT used. For some known IGBTs this current rise time, for example, can be less than 50 ns, 40 ns, 30 ns, 20 ns, or 10 ns. Other rise times may be used. Removal of the gate resistor is one design consideration that produces fast rise times. This can allow for a sufficiently large peak current to flow to the gate to charge it more quickly than specified. The gate may still have some inherent circuit or trace resistance on the order of less than about 2Ω. IGBT manufacturers typically suggest and/or require 5Ω as the minimum gate resistance. Thus, one embodiment of the invention uses a gate resistance much less than the gate resistance recommended by the IGBT manufacturer. Another embodiment of the invention couples a driver with the gate without a resistor therebetween.

Use of a gate driver (e.g., gate driver 106) with a single discrete IGBT is another design consideration that can allow for fast rise times. That is, each of a plurality of IGBTs can be coupled with a single gate driver. Typically, multiple discrete IGBTs or single IGBT modules that include a plurality of IGBTs are coupled with a single driver. A gate driver coupled only with a single discrete IGBT can generate the current needed to rapidly charge a single IGBT gate capacitance to the manufacturer's specified on state voltage level. (e.g., $I_g$>10 A).

Moreover, various combinations of IGBTs and drivers can be used. For example, a single IGBT can be coupled with multiple drivers. As another example, multiple drivers and multiple IGBTs can be coupled together. Any number of combinations can be used.

The reduction of the IGBT gate inductance (e.g. inductance 110) to very low values is another design consideration that can allow for fast rise times (e.g., $L_g$>10 nH). The gate inductance initially acts as high impedance from the driver output to the IGBT gate. The lower the value of the gate inductance the faster the gate can be charged to full voltage. Various techniques are described in this disclosure for producing low gate inductances.

Figure 4:
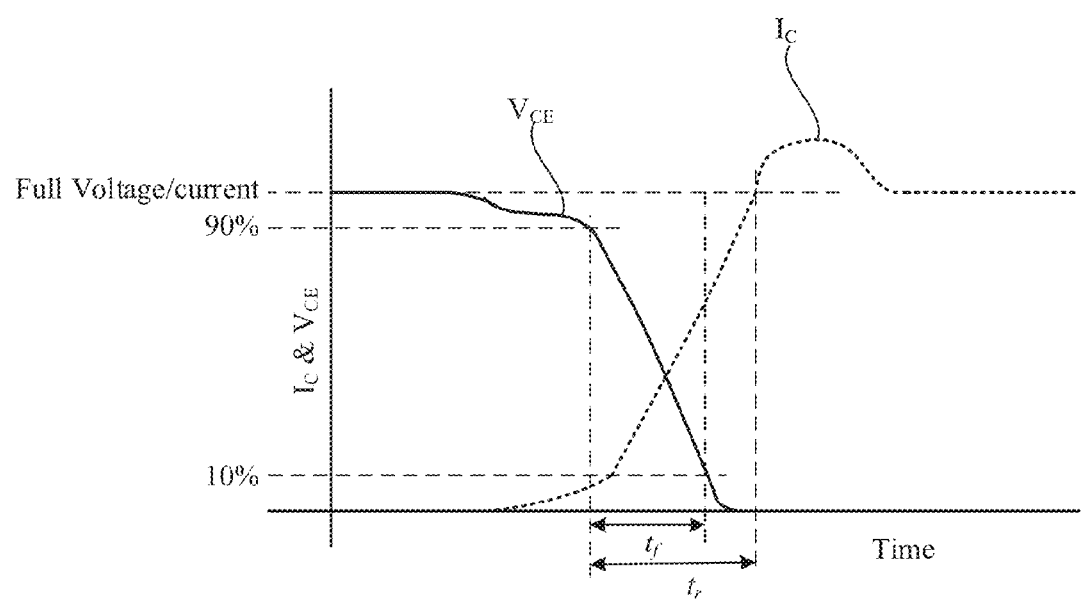
FIG. 4 is a graph of the current rise time and the fall time of the voltage at the collector and emitter according to some embodiments of the invention.

Embodiments of the invention can also allow for a reduction of Collector to Emitter Current ($I_{CE}$) during IGBT turn-on. In some embodiments, the current rise time ($t_r$) through the IGBT at turn-on can be slower than the time it takes to have the collector-to-emitter voltage ($V_{CE}$) fall ($t_f$) from 90% to 10% of its value as shown in FIG. 4. That is, the voltage across the IGBT can go from high to low before the device starts to carry any significant current. This can make the device faster and dissipate less energy during the switching process.

To accomplish current reduction during turn-on, a minimum circuit inductance can be required to effectively choke the current rise-time. This minimum circuit inductance can include any of the following singularly or in combination: IGBT internal emitter inductance ($L_e$) 115, stray inductance 136, slow capacitor inductance 123, and fast capacitor inductance 121. Stray inductance 136 can include any unaccounted-for inductance in IGBT circuit module 100 and/or any inductance in load 130. This minimum inductance can be greater than about 50-100 nH. For example, the combination of stray inductance 136, fast capacitor inductance 121, and IGBT inductance can be between 50 and 100 nH.

Figure 5:
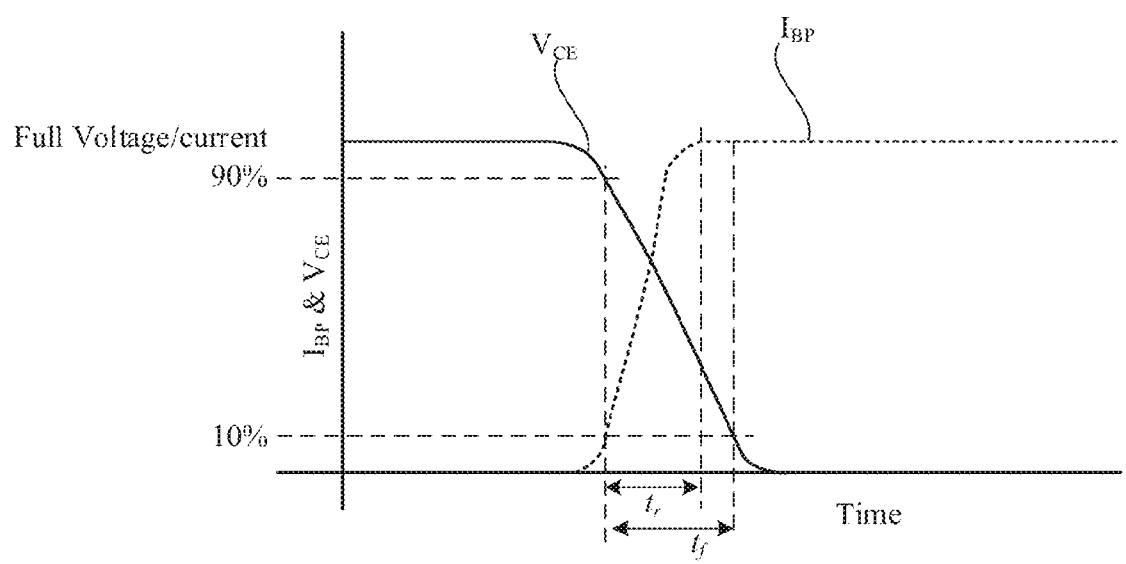
FIG. 5 is a graph of the current rise time at the current bypass circuit and the fall time of the voltage at the collector and emitter according to some embodiments of the invention.

Embodiments of the invention can also allow for fast shunting of current out of the IGBT 114 during device turn-off. This can be accomplished using, for example, current bypass circuit 116. To achieve effective current shunting, the time it takes for 50% of the current to be diverted out of IGBT 114 into current bypass circuit 116 can be less than the time it takes for IGBT 114 to turn off. That is, current bypass circuit 116 can have a current rise time ($t_r$) that is faster than the specified IGBT turn-off time ($t_f$) as shown in FIG. 5. This allows for very low collector to emitter current in IGBT 114 during switching, which makes the device operate faster and/or dissipates less energy during turn-off.

To ensure that current can be passed out of IGBT 114, current bypass inductance 120 can be required to be low enough to allow current to ramp up quickly in the bypass circuit as the IGBT begins to switch. In some embodiments, current bypass circuit 116 can include a capacitor and/or diode in an arrangement similar to a snubber, which can allow current to flow through current bypass circuit 116 until the capacitor is fully charged. While current bypass circuit 116 is somewhat similar to a typical snubber, there are some differences.

Among many design considerations, typical snubbers can be designed to reduce and/or minimize voltage spikes across the IGBT that may occur during switching. Their design can be based on circuit elements that fall outside the loop formed by effective IGBT 112, current bypass 116 and/or inductor 120, as well as by the properties of the circuit IGBT. Current bypass 116 can be designed to allow current to rapidly transition from flowing through the IGBT to flowing through current bypass 116, largely irrespective of other circuit elements. The design of circuit bypass 116 is largely based on circuit elements contained within the loop formed by effective IGBT 112, current bypass 116 and inductor 120, as opposed to those that lie outside of this loop, in contrast to the typical IGBT snubber 118. In some embodiments of the invention current bypass inductance 120 is minimized to a value, for example, below 20 nH or 10 nH. In some embodiments, the combination of current bypass inductance 120 and snubber inductance 122 can be less than 20 nH. With this low inductance, current can rapidly shunt through current bypass circuit 116. This shunting can occur in less than 100 ns, 80 ns, 60 ns, 40 ns, 20 ns, or 10 ns. In some embodiments, current bypass 116 may be combined with snubber 118.

In some embodiments, IGBT 114 can be operated above the manufacture specified continuous collector current ($I_c$) level. This combined with a very low circuit inductance can allow for faster device turn-off times. In most power supply designs, operation above the manufactured specified continuous current level is avoided because high current levels can cause large voltage spikes than can damage the IGBTs. Additionally, high current levels can overheat the IGBTs. Moreover, it can be considered poor circuit design to operate components above/outside the manufacturer's specifications.

It is well known that voltage across an inductor is equal to the inductance and the time rate of change of the current $$\left(V = L\frac{di}{dt}\right).$$

If the circuit inductance is minimized to allow for a maximum rate change of current during turn-off and a current level near, at or above the IGBT's specified continuous current rating is applied, voltage can be developed across internal IGBT internal emitter inductance ($L_e$) 115. This induced voltage can help the device turn-off faster. Circuit inductance can include stray inductance 136 and/or fast capacitor inductance 121 and can have a value on the order of IGBT internal emitter inductance ($L_e$) 115. For example, stray inductance 136 and/or fast capacitor inductance 121 can be less than or equal to IGBT inductance 136. This effect can be seen at current levels near or above the IGBT's specified continuous current rating.

To avoid overheating when operating at current levels above the manufacturer's stated continuous maximum current, a plurality of IGBT circuit modules can be combined in series or parallel that alternate switching between IGBTs. By alternating switching, each IGBT can have a cool-down period, while others IGBTs do the work. In some embodiments, each of two subsets of IGBTs can alternate switching. In other embodiments, each of three or more subsets of IGBTs can alternate switching.

In some embodiments, fast capacitor 126 can be coupled between load 130 and IGBT 114. The inductance of this circuit is represented by fast capacitor inductance 121, and can be very low (e.g., less than 50 nH). Capacitor inductor 121 can be the inherent or internal inductance of fast capacitor 126 and/or the circuitry related to fast capacitor 126.

A low resistance between gate 132 and gate driver 106 can improve the switching efficiency. This low resistance can be realized in a number of ways. In one embodiment, gate 132 can be electrically coupled with gate driver 106 without an external resistor being placed in series between the two components. That is, gate driver 106 and gate 132 can be directly coupled together through a single circuit trace. Of course, some resistance in the trace will be present, but this resistance will be minimal (e.g., less than 0.1 ohms). In another embodiment, gate driver 106 and IGBT 114 can be placed very near one another on the circuit module. For example, this distance can be less than 1 cm, 500 mm, 100 mm, 50 mm, 10 mm, 1 mm, etc. In yet another embodiment, the line trace on the circuit module between gate driver 106 and gate 132 can have a resistance less than 1Ω, 500 mΩ, 100 mΩ, 50 mΩ, 10 mΩ, 1 mΩ, etc.

IGBTs are typically operated with a Collector to Emitter Voltage ($V_{CE}$) lower than the Collector to Emitter Voltage specified by the manufacturer to avoid over voltage spikes during switching. In a circuit with inductance, when current is changing over time the resulting voltage is a function of the inductance and the rate of the current change over time $$\left(V = L\frac{di}{dt}\right).$$

This voltage coupled with the operating voltage can produce voltage spikes above the tolerances of the IGBT. To mitigate these spikes, circuit designers usually slow the switching speed and/or drive the IGBT with a voltage below tolerance to accommodate spikes. Embodiments of the invention, however, include circuit modules that can switch at higher switching speeds and/or be driven with voltages at or above the manufacturer specified Collector to Emitter Voltage.

This can be accomplished in a number of ways. One example is to lower the inductance at the gate. Lower inductances can allow for faster switching without inducing or increasing voltage spikes. To do this, the trace between gate driver 106 and gate 132 can be shorter than standard (e.g., around 10 mm) and/or wider than standard (e.g., around 4 mm). This short and/or wide trace can lower both the inductance and the resistance of gate driver 106. Various trace lengths can be used, for example, trace lengths less than 20 mm, 15 mm, 5 mm, 2 mm, or 1 mm can be used. Various trace widths can be used, for example, trace widths greater than 1 mm, 2 mm, 3 mm, 4 mm, 5 mm, 6 mm, 7 mm, 8 mm, 9 mm, 10 mm can be used.

Various other inductance lowering techniques can be used. By employing these techniques the inductance at the gate can be less than 100 nH, 50 nH, 40 nH, 20 nH, 10 nH, 5 nH, or 1 nH. For example, multiple traces can be run in various board layers, and/or on the underside of the board.

In another embodiment, the inductance of the entire circuit module without the IGBT can be less than the inductance of the IGBT (e.g., inductance 115). In yet another embodiment, the inductance of the gate circuit is less than the inductance of the IGBT.

In some embodiments, a plurality of IGBT modules can be coupled together in series to provide higher voltage and/or parallel to provide higher current. For example, if each IGBT module can switch 1 kV, then 20 IGBT modules can be coupled in series to switch 20 kV. Various other configurations can also be used. A similar strategy can be employed for increasing the current with a parallel configuration.

IGBT modules according to embodiments of the invention can have turn-on delay times ($t_{d(on)}$) and/or turn-off delay times ($t_{d(off)}$) that are shorter than the manufacture specified times. For example, an IGBT module can have a turn-on delay time $t_{d(on)}$ and/or a turn-off delay time ($t_{d(off)}$) that is less than half the manufactured specified time. As another example, an IGBT module can have a turn-on delay time ($t_{d(on)}$) and/or a turn-off delay time ($t_{d(off)}$) that is less than one-fourth the manufactured specified time.

FIG. 2 shows series configuration 200 with four IGBT modules 230, 231, 232, and 233 in series with load 130. Each IGBT module includes receiver 102, pre-driver 104, gate driver 106, and IGBT 114. Various other components may be present such as snubber and/or current bypass circuitry.

Each IGBT module can be electrically isolated from one another. This isolation can allow each IGBT to divide the load voltage among the collector-to-emitter voltages of the four IGBT modules. Using a fiber optic receiver for receiver 102, switching signals can be isolated from one another. Moreover, each IGBT board can float relative to one another. That is, each board may be tied to an independent common 215. Common 215 can be isolated from the other commons using transformer isolation or other isolation techniques. In this way, each board only switches its collector-to-emitter voltage. But the sum of the collect-to-emitter voltages of all the IGBT modules will be the load voltage.

Power can be brought to each board at various levels. For example, power input 205 can be 5 volt power supply, power input 210 can be from a 35 volt power supply, and power input 220 can be from a 10 volt power supply.

Various other configurations of IGBT modules can be used. For example, series configuration 200 can include any number of IGBT modules coupled together in series. As another example, multiple series configurations can be coupled together in parallel to allow for increased current switching. And as another example, multiple IGBT modules can be configured in parallel and then arranged in series.

Figure 6A:
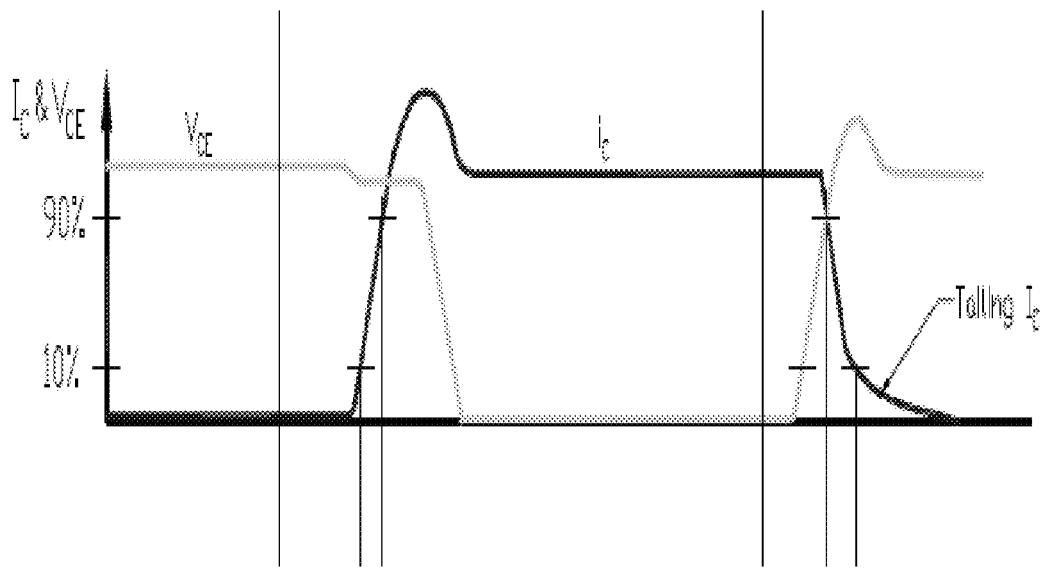
FIG. 6A is a graph of the collector current and the voltage between the collector and emitter for a standard IGBT.

FIG. 6A shows typical rise and fall times of an IGBT circuit. In this example, rise times of 100 ns and fall times of 400 ns are typical. These values may vary based on individual IGBTs.

As an IGBT switches open, the current waveform can often be characterized as having a sharp fall in current, followed by a long slow drop in the current to zero. This long slow current drop is often called the tail current. Some definitions of the IGBT turn off time include this tail current, while others do not. In some embodiments of the invention, both the fall time and/or the tail current can lowered to levels below the manufactured specified levels.

Figure 6B:
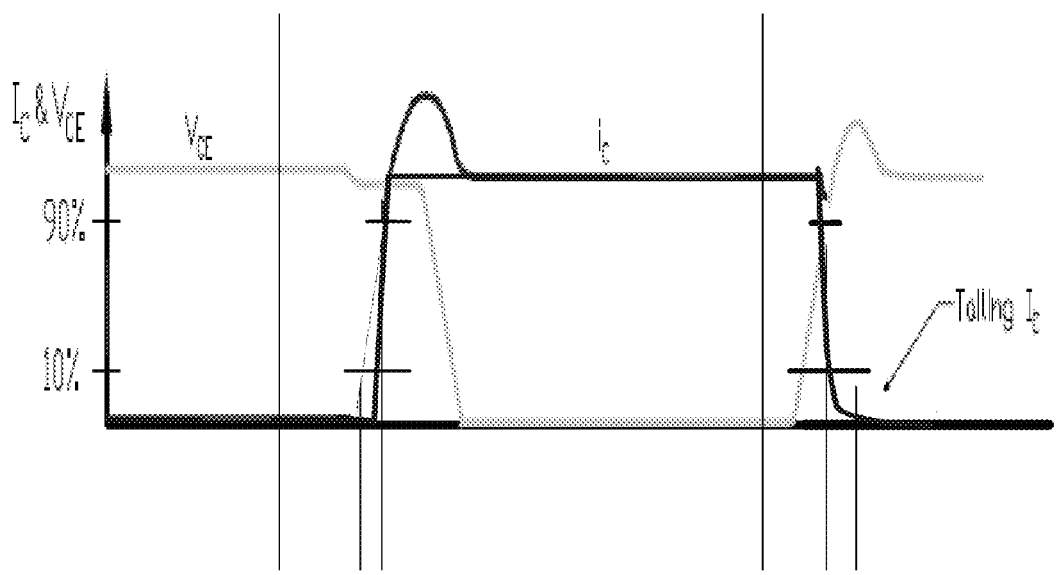
FIG. 6B is a graph of the collector current and the voltage between the collector and emitter for an IGBT circuit module according to embodiments of the invention.

Switching energy loss can be a significant source of power loss in IGBTs where switching is defined by the time it takes to largely either transition the device from either the conducting or non-conducting state, typically characterized as specified device rise/fall times. For example, the rise times can be specified by the amount of time it takes to rise from 10% to 90% or values. The fall times can be specified by the amount of time it takes to fall from 90% to 10% of the full value. FIG. 6B shows rise and fall times from an IGBT circuit that implements embodiments of the invention. Note that the rise time is below 40 ns and the fall time is less than 100 ns. According to embodiments of the invention, improved rise and fall times similar to those shown in FIG. 6B may be obtained using the same IGBT having the rise and fall times shown in FIG. 6A with the circuit module configuration disclosed herein.

The foregoing is provided for purposes of illustrating, explaining, and describing embodiments of the present invention. Further modifications and adaptations to these embodiments will be apparent to those skilled in the art and may be made without departing from the scope or spirit of the invention. Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

What is claimed is:

1. An IGBT circuit module comprising
a circuit board;
an IGBT coupled with the circuit board having a gate, a collector, and an emitter;
a driver that provides current to the gate of the IGBT coupled with the circuit board; and
a plurality of traces, wherein a first trace of the plurality of traces electrically couples the gate and the driver, wherein the length of the first trace is less than 1 cm, wherein the circuit module is configured to couple with a load between the emitter and the collector.

2. The IGBT circuit module according to claim 1, wherein the IGBT includes a manufacturer-specified current rise time, and wherein the voltage at the gate is brought to a full voltage in a time less than the manufacturer-specified current rise time.

3. The IGBT circuit module according to claim 1, wherein the IGBT includes a manufacturer-specified current fall time, and wherein the voltage at the gate is discharged in a time less than the manufacturer-specified current fall time.

4. The IGBT circuit module according to claim 1, wherein the IGBT includes a manufacturer-specified current rise time, and wherein the voltage between the collector and the emitter is brought to a minimum voltage in a time less than the manufacturer-specified current rise time.

5. The IGBT circuit module according to claim 1, wherein the IGBT circuit module includes an internal circuit module inductance that is greater than 50 nH.

6. The IGBT circuit module according to claim 5, wherein the internal circuit module inductance includes either or both an internal IGBT inductance and a stray circuit module inductance.

7. The IGBT circuit module according to claim 1, further comprising a current bypass circuit between the collector and the emitter.

8. The IGBT circuit module according to claim 1, wherein the driver is coupled with a single IGBT.

9. The IGBT circuit module according to claim 1, wherein the driver is coupled with a pre-driver.

10. The IGBT circuit module according to claim 1, wherein the first trace directly couples the driver with the gate without an additional component.

11. The IGBT circuit module according to claim 1, wherein the first trace directly couples the driver with the gate without a resistor.

12. The IGBT circuit module according to claim 1, wherein the IGBT has a manufacturer-specified switching loss, and the switching loss of the IGBT circuit module is less than the manufacturer-specified switching loss.

13. The IGBT circuit module according to claim 1, wherein the IGBT has a manufacturer-specified rise time, and the rise time of the IGBT circuit module is less than the manufacturer-specified rise time.

14. The IGBT circuit module according to claim 1, wherein the IGBT has a manufacturer-specified fall time, and the fall time of the IGBT circuit module is less than the manufacturer-specified fall time.

15. The IGBT circuit module according to claim 1, wherein the IGBT has a manufacturer specified turn-on delay time, and the turn-on delay time of the IGBT circuit module is less than the manufacturer specified turn-on delay time.

16. The IGBT circuit module according to claim 1, wherein the IGBT has a manufacturer specified turn-off delay time, and the turn-off delay time of the IGBT circuit module is less than the manufacturer specified turn-off delay time.

17. The IGBT circuit module according to claim 1, wherein the turn-off delay time is less than 100 ns.

18. The IGBT circuit module according to claim 1, wherein the turn-on delay time is less than 40 ns.

19. An IGBT circuit module comprising
a circuit board;
an IGBT coupled with the circuit board having a gate, a collector, and an emitter;
a driver that provides current to the gate of the IGBT coupled with the circuit board; and
a plurality of traces, wherein a first trace of the plurality of traces electrically couples the gate and the driver, wherein the first trace has an inductance less than 100 nH,
wherein the circuit module is configured to couple with a load between the emitter and the collector.

20. An IGBT circuit module comprising
a circuit board;
an IGBT coupled with the circuit board having a gate, a collector, and an emitter;
a driver that provides current to the gate of the IGBT coupled with the circuit board; and
a plurality of traces, wherein a first trace of the plurality of traces electrically couples the gate and the driver, wherein the first trace has an inductance less than 1 ohm,
wherein the circuit module is configured to couple with a load between the emitter and the collector.

* * * * *